US006533952B2

(12) United States Patent
Klebanoff et al.

(10) Patent No.: US 6,533,952 B2
(45) Date of Patent: Mar. 18, 2003

(54) MITIGATION OF RADIATION INDUCED SURFACE CONTAMINATION

(75) Inventors: Leonard E. Klebanoff, Dublin, CA (US); Richard H. Stulen, Livermore, CA (US)

(73) Assignee: EUV LLC, Santa Clara, CA (US)

(*) Notice: Subject to any disclaimer, the term of this patent is extended or adjusted under 35 U.S.C. 154(b) by 0 days.

(21) Appl. No.: 09/470,860

(22) Filed: Dec. 23, 1999

(65) Prior Publication Data

US 2001/0053414 A1 Dec. 20, 2001

Related U.S. Application Data

(60) Provisional application No. 60/138,077, filed on Jun. 8, 1999.

(51) Int. Cl.$^7$ .................................................. C23F 1/00
(52) U.S. Cl. .............................. 216/67; 134/1; 134/1.1; 134/21; 134/21.1
(58) Field of Search .................. 134/1, 1.1, 21, 134/21.1; 216/67

(56) References Cited

U.S. PATENT DOCUMENTS

| | | | | |
|---|---|---|---|---|
| 5,312,519 A | * | 5/1994 | Sakai et al. ..................... | 134/1 |
| 5,362,330 A | * | 11/1994 | Preussner et al. ............... | 134/1 |
| 5,367,139 A | * | 11/1994 | Bennett et al. ......... | 219/121.59 |
| 5,814,156 A | * | 9/1998 | Elliott et al. .................... | 134/1 |

FOREIGN PATENT DOCUMENTS

| | | | |
|---|---|---|---|
| JP | 56-021333 | * | 2/1981 |
| JP | 56-125840 | * | 10/1981 |
| JP | 62-124285 | * | 6/1987 |
| JP | 06-302565 | * | 10/1994 |
| JP | 10-050656 | * | 2/1998 |
| JP | 10-098019 | * | 4/1998 |
| JP | 10-233388 | * | 9/1998 |
| JP | 11-111588 | * | 4/1999 |

OTHER PUBLICATIONS

"Cleaning of Carbon Contaminated Vacuum Ultraviolet Optics: Influence On Surface Roughness and Reflectivity", Rev. Sci. Instrum. (1992'), 63 (1, Pt. 2B); pp. (1428–1431).*

* cited by examiner

Primary Examiner—George Goudreau
(74) Attorney, Agent, or Firm—Donald A. Nissen

(57) ABSTRACT

A process for mitigating or eliminating contamination and/or degradation of surfaces having common, adventitious atmospheric contaminants adsorbed thereon and exposed to radiation. A gas or a mixture of gases is introduced into the environment of a surface(s) to be protected. The choice of the gaseous species to be introduced (typically a hydrocarbon gas, water vapor, or oxygen or mixtures thereof) is dependent upon the contaminant as well as the ability of the gaseous species to bind to the surface to be protected. When the surface and associated bound species are exposed to radiation reactive species are formed that react with surface contaminants such as carbon or oxide films to form volatile products (e.g., CO, $CO_2$) which desorb from the surface.

10 Claims, 4 Drawing Sheets

MITIGATION OF RADIATION INDUCED SURFACE CONTAMINATION

CROSS-REFERENCE TO RELATED APPLICATIONS

This Application claims the benefit of U.S. Provisional Application No. 60/138,077, filed Jun. 8, 1999, and entitled METHOD FOR REDUCING RADIATION-INDUCED CONTAMINATION OF LITHOGRAPHIC COMPONENTS.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND OF THE INVENTION

The present invention is directed generally to a process for mitigating degradation and contamination of surfaces caused by radiation induced breakdown of molecules and their subsequent reaction and/or deposition on these surfaces. More particularly, the process disclosed herein is directed to protection of the surfaces of components of a lithographic stepper, such as the mask and imaging optics, from the consequences of radiation induced molecular breakdown.

Photolithography is a well-known technique for applying patterns to the surface of a workpiece, such as a circuit pattern to a semiconductor chip or wafer. This technique has the advantage of being able to faithfully reproduce small and intricate patterns. Traditional photolithography involves applying electromagnetic radiation to a mask having openings formed therein (transmission mask) such that the light or radiation that passes through the openings is applied to a region on the surface of the workpiece that is coated with a radiation-sensitive substance, e.g., a photoresist. The mask pattern is reproduced on the surface of the workpiece by removing the exposed or unexposed photoresist. However, the capabilities of conventional photolithographic techniques have been severely challenged by the need for circuitry of increasing density and higher resolution features. The demand for smaller feature sizes has inexorably driven the wavelength of radiation needed to produce the desired pattern to ever-shorter wavelengths. As the wavelength of the applied radiation is made shorter the energy of the radiation becomes greater to the point where the radiation can cause the decomposition of molecules adsorbed on or proximate to a surface to produce reactive species that can attack, degrade, or otherwise contaminate the surface.

While short wavelength radiation can directly dissociate molecules, secondary electrons, created by the interaction of this radiation with surfaces, are the primary agents for molecular dissociation. Low energy (5–10 eV) secondary electrons are known to be very active in breaking chemical bonds by direct ionization of adsorbed molecules or by electron attachment, wherein a secondary electron binds to a molecule producing a reactive negative ion that then de-excites to a dissociated product. Any type of radiation (photons, electrons, ions, and particles) that is energetic enough to liberate electrons can create secondary electrons; typically, energies of about 4–5 eV are required. Consequently, radiation induced contamination, i.e., contamination of surfaces by reactive species produced by secondary electrons originating from radiative interactions, will most certainly occur in lithographic processes that use energetic radiation such as: extreme ultraviolet lithography (photon energy≈100 eV), projection electron lithography (electron energy≈50–100 keV), ion beam lithography (ion energy>10 keV), 193 nm lithography (photon energy≈6.4 eV) and 157 nm lithography (photon energy≈7.9 eV). Thus, the potential for contamination of critical lithographic components, such as masks and optical surfaces, and degradation of their operational capability is present in all the advanced lithographic processes.

A mechanism for the contamination of surfaces having gaseous species adsorbed thereon and exposed to an incident flux of radiation is illustrated schematically in FIG. 1. Here, surface 110 has both hydrocarbon and water molecules adsorbed thereon. The term "hydrocarbon" can include any carbon containing species. Exposure to a radiation flux causes secondary electrons to be emitted from surface 110 that can dissociate the adsorbed hydrocarbon molecules to form reactive carbon fragments that can form a graphite layer on the surface. By way of example, exposure of a Si-terminated Mo/Si multilayer mirror to a flux density of about 330 mW/mm$^2$ of 13.4 nm radiation at a background pressure of 1×10$^{-7}$ Torr for about 45 hours results in the growth of a layer of graphitic carbon having a thickness of about 230 Å. The graphitic carbon film, produced by the secondary-electron-induced dissociation of hydrocarbon molecules adsorbed on the surface from this environment reduced mirror reflectivity from 66% to 12%, a loss in reflectivity that would render the multilayer mirror inoperable in a lithographic stepper.

Similarly, secondary electrons emitted from surface 110 in response to the radiation flux can dissociate adsorbed water molecules to form reactive oxygen species that can oxidize a surface to form an oxide film that can degrade the reflectivity of a mirror by absorption of radiation. Thus, oxidation resulting from radiation induced dissociation of water molecules can catastrophically and irreversibly damage optical surfaces. By way of example, exposure of a Si-terminated Mo/Si multilayer mirror to a flux density of about 330 mW/mm$^2$ of 13.4 nm radiation and 1×10$^{-7}$ Torr of water vapor for about 24 hours results in the growth of a layer of SiO$_2$. This SiO$_2$ layer, which cannot be removed without damaging the Mo/Si multilayer structure, caused reflectivity to be reduced from 66% to 59%, a result that is unacceptable for operational purposes.

Accordingly, what is required is a process for eliminating or significantly mitigating contamination and/or degradation of surfaces, and particularly surfaces of critical lithographic components, exposed to radiation in the presence of common contaminants such as hydrocarbons and water vapor. This is especially true for the emerging lithographic processes that use shorter wavelength and thus higher energy radiation because of the significant potential for degrading critical components and the extreme sensitivity of these components to small changes in surface properties.

SUMMARY OF THE INVENTION

It is an object of the present invention to provide a process for mitigating or eliminating contamination of surfaces by common, adventitious atmospheric molecular compounds dissociated by exposure to a radiative flux.

It is a further object to provide a process that operates effectively at sub-atmospheric pressures.

In the inventive process disclosed herein a gas or a mixture of gases is introduced into the environment of a surface(s) to be protected. The choice of the gaseous species to be introduced is dependent upon the contamination as well as the ability of the gaseous species to bind to the surface to be protected The latter criterion is invoked so that secondary electrons emitted from the surface in response to incident radiation can dissociate the adsorbed species. When the surface and associated bound species are exposed to radiation, reactive species are formed that react with surface contamination such as carbon or oxide films to form volatile products (e.g., CO, $CO_2$) which desorb from the surface.

DETAILED DESCRIPTION OF THE INVENTION

The present invention is directed to a process for mitigating or eliminating contamination and/or degradation of surfaces having common, adventitious atmospheric contaminants adsorbed thereon and exposed to energetic radiation. These contaminants can include such species as hydrocarbons and water vapor that can be inherently present in the atmosphere of any system and generally can arise from such sources as materials of construction, vacuum pump oils and greases. Energetic radiation can be photons, electrons, or ions. This invention finds particular utility in those lithographic processes that employ highly energetic radiation and thus present a significant potential for contamination and, as a consequence, degradation of the performance of critical components.

While the process of the present invention is illustrated by application to extreme ultraviolet (EUV) lithography, and particularly to the mitigation of two common forms of contamination prevalent therein, carbon deposition and oxidation, its use is not limited to lithographic operations or elimination of carbon deposition or oxidation but is contemplated to be applicable generally.

Figure 1:
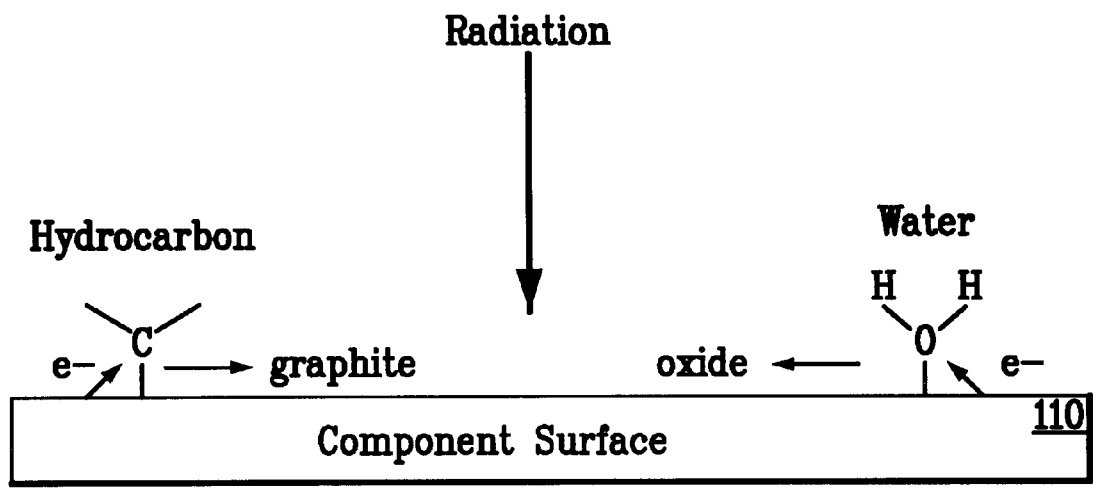
FIG. 1 illustrates schematically a process resulting in surface contamination.
Figure 2:
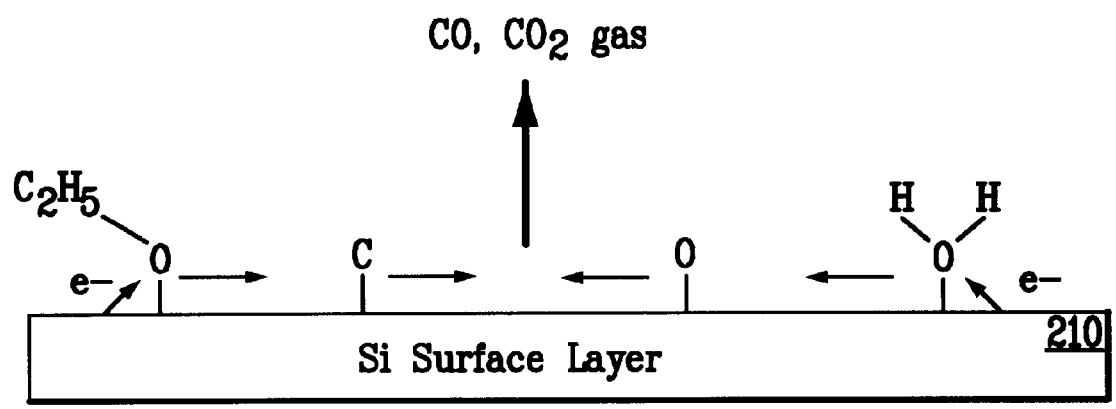
FIG. 2 illustrates schematically an embodiment of the present invention.

The process of the present invention is illustrated and explained by reference to FIG. 2, which shows a Si surface 210 of a Mo/Si multilayer mirror. Generally, water vapor will be present in any system, particularly an unbaked vacuum system. Thus, adventitious water vapor arises from outgassing of various system components and these water vapor molecules can be adsorbed onto any surface, such as illustrated by FIG. 2. Subjecting surface 210 to high energy radiation, such as by EUV radiation, can cause secondary electrons to be ejected from surface 210. As discussed above, these electrons can react with the adsorbed water molecules causing them to dissociate into reactive oxygen species that will, in turn, react with the Si surface. Prior to exposing surface 210 to incident radiation a small amount of a hydrocarbon gas that will also bind to surface 210 is admitted to the system. In the example illustrated by FIG. 2, the hydrocarbon gas is ethanol ($C_2H_5OH$). As was the case with bound water vapor, $C_2H_5OH$ molecules bound to surface 210 will also be dissociated by the secondary electrons ejected from that surface. Reactive carbon fragments from the dissociated $C_2H_5OH$ can react with reactive oxygen species on surface 210 to form volatile products such as CO and $CO_2$. In this way reactive oxygen species that could oxidize the Si surface and degrade its reflectivity are eliminated.

It will be appreciated that the process described above can function in the opposite manner. That is, when an environment is rich in carbon containing gases carbon contamination of surfaces can be produced by radiation exposure and the primary surface contaminant can be graphitic carbon. As discussed above, the presence of graphitic carbon on mirror surfaces can cause drastic reductions in their reflectivity for EUV radiation. Therefore, in these cases it is advantageous to admit an oxygen containing gas into the environment, such as water vapor or molecular oxygen. By substituting water vapor or molecular oxygen for a hydrocarbon gas, the same process as discussed above and illustrated in FIG. 2 can remove carbon contamination as carbon oxides (CO and $CO_2$).

A demonstration of the ability of the novel process described herein to eliminate surface contamination caused by exposure of adventitious molecular species to high energy radiation is given by the following examples.

EXAMPLE 1

Figure 3A:
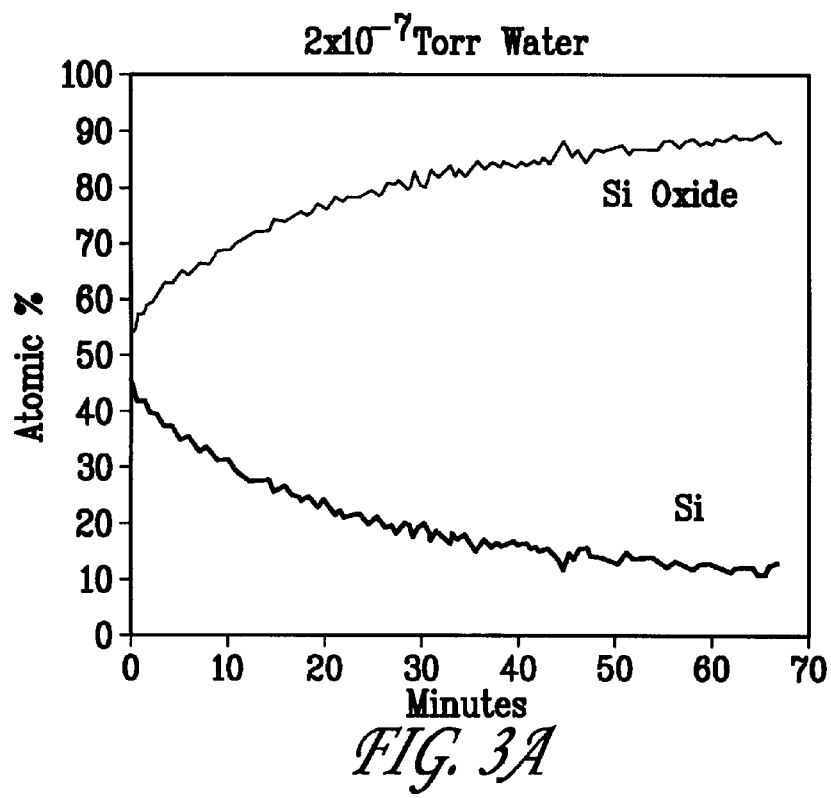
FIG. 3A depicts the oxidation of a Si surface exposed to electron beam irradiation and water vapor.

Initially, a Si-terminated multilayer mirror was exposed to an electron beam current density of $\approx 5$ $\mu A/mm^2$ at a beam energy of 2 keV in the presence of $\approx 2 \times 10^{-7}$ Torr of water vapor. The chemical composition of the surface of the mirror was monitored as a function of time. The Auger peak heights (which reflect the surface composition) of Si and $SiO_2$ are shown in FIG. 3A. It can be seen that the composition of the surface changed rapidly from Si to $SiO_2$ as oxidation progressed with a corresponding degradation in reflectivity.

Figure 3B:
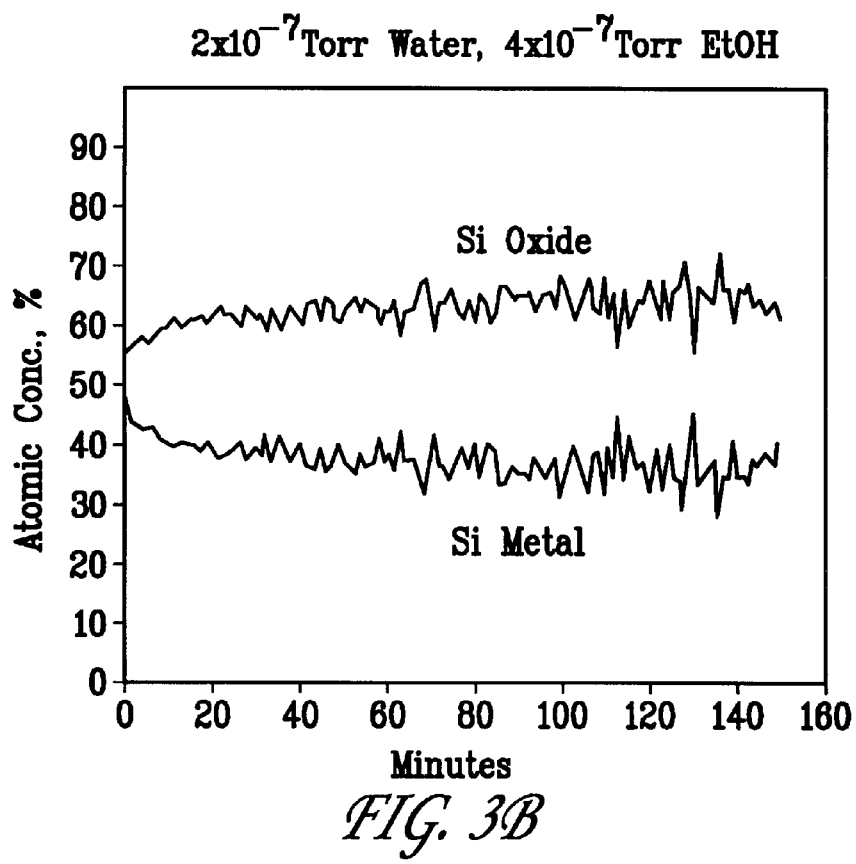
FIG. 3B shows mitigation of oxidation caused by the addition of ethanol.

The experiment above was repeated except that $\approx 4 \times 10^{-7}$ Torr of ethanol was added to the $2 \times 10^{-7}$ Torr of water vapor the environment contained. As before, the chemical composition of the surface of the mirror was monitored as a function of time and the results are shown in FIG. 3B. It can be seen that, in contrast to the case where only water vapor was present, there is only a very small amount of $SiO_2$ present on the Si mirror surface; an amount consistent with the native oxide film typically found on Si. Further, post exposure analysis of the surface of the exposed mirror surface showed the presence of a film of graphitic carbon$\approx 5$ Å thick.

It is the presence of a native oxide film on Si that determines the choice of the gas phase molecules used to protect against surface contamination. Recalling that one important prerequisite for the choice of gas phase molecules is that these molecules must first bind to the surface to be protected so that dissociation by secondary electron emission can take place, thereby liberating reactive species on the surface itself. Consequently, the preferred hydrocarbon molecules are those that will bind to native surface constituents, for example, a polar, hydroxylated film such as can be found on the surfaces of glasses, metals, and silicon. Therefore, hydrocarbon molecules containing such polar functional groups as ketones, aldehydes, esters, alcohols, amines, thiols, and carboxylic acids that will bind well to hydroxylated surfaces are preferred. It has been shown that non-hydrogen bonding hydrogen molecules, such as ethane, cannot confer any protection from oxidation to Si surfaces, presumably because these non-polar molecules cannot bind to the Si surface, and by analogy to any hydroxylated surface. Moreover, because the sticking coefficients for both ethanol and water vapor on a graphitic carbon surface are very small the growth of the graphitic carbon film produced when ethanol was used to provide oxidation protection tends to be self-limiting to a thickness of about 5 Å. Thus, the use of ethanol cannot lead to the formation of a catastrophically thick carbon layer, which itself would be undesirable. The self-limiting behavior leads to a large process latitude for the prevention method.

EXAMPLE 2

A Si-terminated Mo/Si mirror was exposed to 13.4 nm EUV radiation at a power level of ≈7 mW/mm$^2$. The mirror was exposed to four different exposure conditions and the secondary electron emission was plotted as a function of time in FIG. 4. The exposure conditions were: background pressure (≈4×10$^{-9}$ Torr); ethanol alone at a pressure of 4×10$^{-7}$ Torr; water vapor alone at a pressure of 2×10$^{-7}$ Torr; and a mixture of ethanol (4×10$^{-7}$ Torr) and water vapor (2×10$^{-7}$ Torr). Secondary electron emission has been shown to be a useful monitor of the surface processes because the onset of oxidation is signaled by a very rapid increase in secondary electron emission that is due to EUV absorption by oxygen with subsequent emission of secondary electrons. On the other hand, carbon deposition is signaled by a decrease in secondary electron emission due to the poor secondary electron emission characteristics of carbon.

Figure 4:
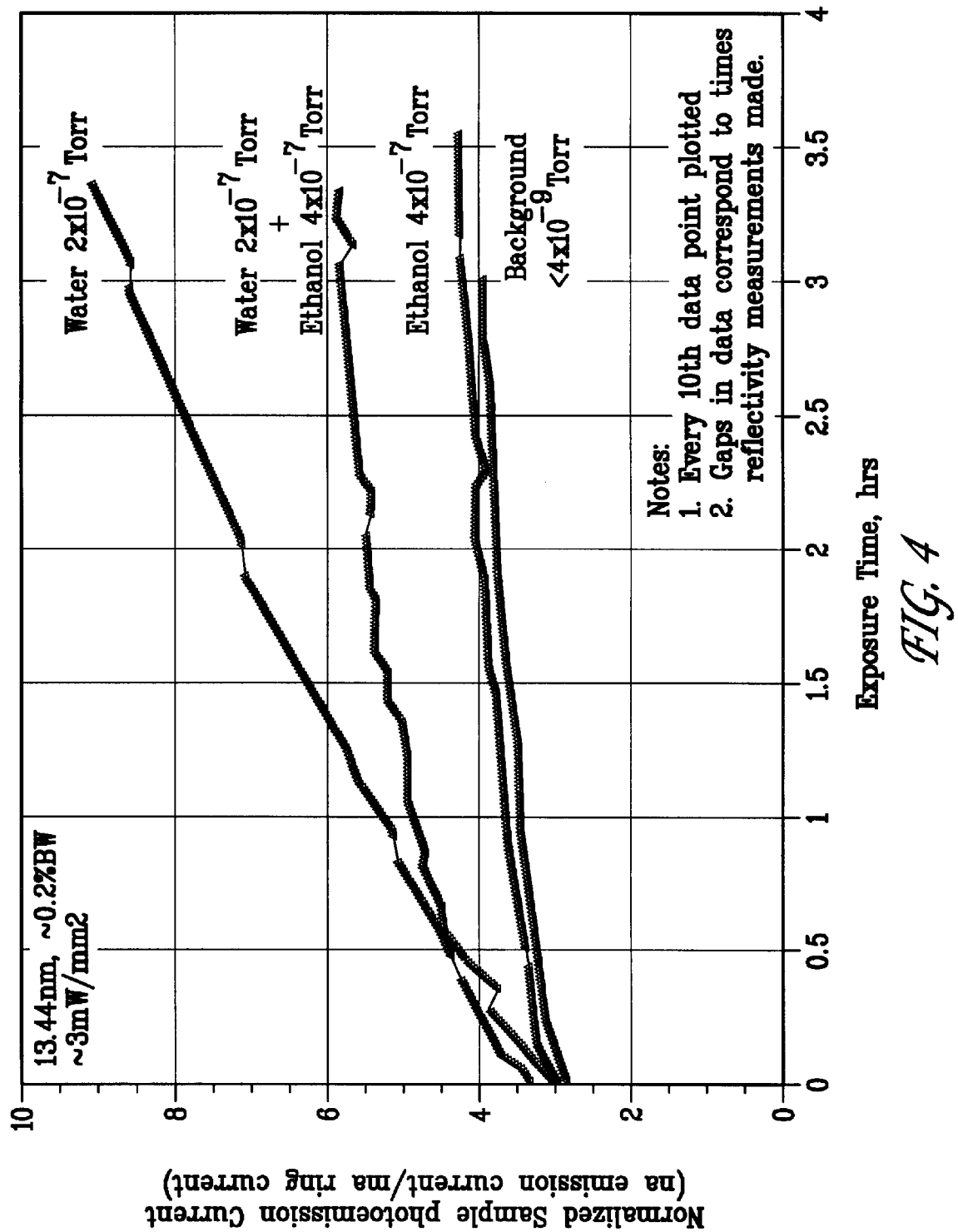
FIG. 4 shows the effect of water vapor and ethanol on a Si surface exposed to EUV radiation.

Referring now to FIG. 4, it can be seen that exposure of the Si surface to water vapor in the presence of EUV radiation is accompanied by a rapid increase in the secondary electron signal denoting the formation of an oxide film. However, when ethanol is admitted the increase in secondary electron signal attributable to surface oxidation is significantly reduced demonstrating that the introduced hydrocarbon (ethanol) limited oxidation of the terminal Si surface. Further adjustment in the water/hydrocarbon ratio could achieve a balance point where carbon deposition and oxidation would balance each other.

As discussed above, exposure of carbon containing gases to high energy radiation can result in the formation of graphitic carbon films on surfaces, such as mirror surfaces, with detrimental effects to their reflectivity for EUV radiation. However, by the use of water vapor or oxygen in the disclosed process it is possible to remove graphitic carbon films. This is demonstrated in the example below.

EXAMPLE 3

Figure 5:
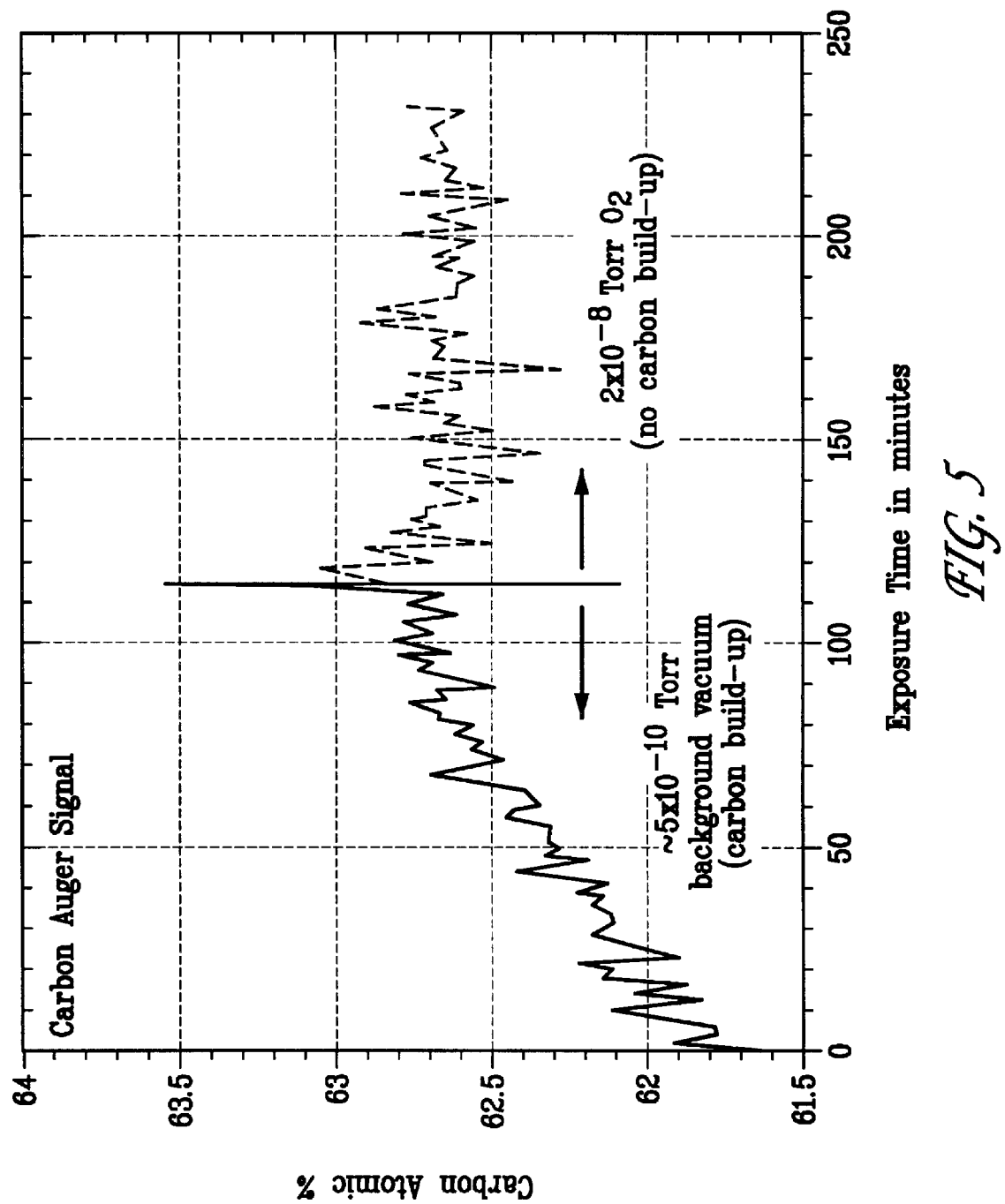
FIG. 5 shows the effect of molecular oxygen on carbon deposition.

Referring now to FIG. 5, where it is shown that electron irradiation of adventitious hydrocarbon molecules present in a vacuum system can result in carbon deposition. Here, a 2 kV electron beam, at a current density of about 5 $\mu$A/mm$^2$, is incident onto a Si-terminated Mo/Si multilayer mirror. The mirror is maintained at a vacuum of ≈5×10$^{-10}$ Torr. As exposure to the incident electron beam increases, an increase in atomic percentage of carbon on the mirror surface takes place. After about 120 minutes of exposure, ≈2×10$^{-8}$ Torr of molecular oxygen is admitted to the vacuum chamber. At that time, the increase in carbon deposition stops and no measurable additional carbon deposition occurs Those skilled in the art will appreciate the importance of not adversely impacting the transmission of radiation, particularly for lithographic applications, by added gaseous components. The present invention provides an important advantage in this regard since, as exemplified above, the partial pressures of the various added gaseous molecular species need be only as high as necessary to affect surface chemistry. The use of gas pressures up to about 1×10$^{-5}$ Torr would generally be adequate to provide a protective effect for most contamination problems while having negligible impact on lithographic throughput or uniformity. By way of example, the transmission of EUV radiation at 13.4 nm through 2 meters of a water/ethanol gas mixture, with each component at a partial pressure of about 1×10$^{-5}$ Torr would be reduced by only about 0.05%.

In summary, the present invention provides a process for reducing or eliminating contamination and oxidation of surfaces caused by the interaction of high energy radiation on adventitious impurities. In particular, the process disclosed here can be used for reducing or eliminating oxide or carbon films on surfaces, such as the surface of silicon mirrors. Most particularly, the present invention provides special advantage in removing or reducing surface contamination in those components, such as masks and imaging optics, used in lithographic applications.

The above described method and the examples pertaining thereto are merely illustrative of applications of the principles of this invention and many other embodiments and modifications can be made by those of skill in the art without departing from the spirit and scope of the invention as defined in the claims.

We claim:
1. A process for preventing the formation of surface contamination of surfaces exposed to radiation, comprising:
   a) providing an enclosed space having a surface disposed therein, wherein the atmosphere within the enclosed space contains contaminants; and wherein the surface is characterized by having the atmospheric contaminants adsorbed thereon;
   b) introducing into the enclosed space a gas that binds to the surface, wherein the enclosed space is at a sub-atmospheric pressure; and
   c) subjecting the contents of the enclosed space to radiation whose energy is greater than about 5 eV.

2. The process of claim 1, wherein the gas is a hydrocarbon gas, water vapor or oxygen, or combinations thereof, and wherein the hydrocarbon gas is comprised of hydrocarbon molecules that contain at least one functionality selected from the group that includes ketones, aldehydes, esters, alcohols, amines, thiols, and carboxylic acids.

3. A process for preventing the formation of surface contamination of lithographic surfaces, comprising:
   a) providing an enclosed space having at least one surface disposed therein, wherein the enclosed space is at sub-atmospheric pressure and the atmosphere within the enclosed space contains contaminants and wherein the lithographic surface is characterized by having the atmospheric contaminants adsorbed thereon;
   b) introducing into the enclosed space a gas that binds to the surface; and
   c) subjecting the contents of the enclosed space to radiation whose energy is greater than about 5 eV.

4. The process of claim 3, wherein the gas is a hydrocarbon gas, water vapor or oxygen, or combinations thereof, and wherein the hydrocarbon gas is comprised of hydrocarbon molecules that contain at least one functionality selected from the group that includes ketones, aldehydes, esters, alcohols, amines, thiols, and carboxylic acids.

5. The process of claim 3, wherein the partial pressure of the gas is less than about 10$^{-5}$ Torr.

6. The process of claim 3, wherein the surface is the Si-terminated surface of a Mo/Si multilayer mirror.

7. The process of claim 1, wherein the high energy radiation is extreme ultraviolet radiation.

8. The process of claim 3, wherein the high energy radiation is extreme ultraviolet radiation.

9. The process of claim 2, wherein the hydrocarbon gas is ethanol.

10. The process of claim 4, wherein the hydrocarbon gas is ethanol.

* * * * *